United States Patent
Grewing et al.

(10) Patent No.: US 7,142,063 B2
(45) Date of Patent: Nov. 28, 2006

(54) TWO-POINT MODULATOR COMPRISING A PLL CIRCUIT AND A SIMPLIFIED DIGITAL PRE-FILTERING SYSTEM

(75) Inventors: Christian Grewing, Düsseldorf (DE); Markus Hammes, Dinslaken (DE); Stefan Van Waasen, Duisburg (DE)

(73) Assignee: Infineon Technologies AG, Munich (DE)

(*) Notice: Subject to any disclaimer, the term of this patent is extended or adjusted under 35 U.S.C. 154(b) by 196 days.

(21) Appl. No.: 10/479,788

(22) PCT Filed: May 24, 2002

(86) PCT No.: PCT/DE02/01914

§ 371 (c)(1),
(2), (4) Date: May 27, 2004

(87) PCT Pub. No.: WO02/099961

PCT Pub. Date: Dec. 12, 2002

(65) Prior Publication Data

US 2004/0192231 A1    Sep. 30, 2004

(30) Foreign Application Priority Data

Jun. 7, 2001    (DE) ................. 101 27 612

(51) Int. Cl.
*H03L 7/00*    (2006.01)
(52) U.S. Cl. .............. 331/16; 331/1 A; 332/127; 332/128; 327/157; 327/159; 375/376
(58) Field of Classification Search .......... 331/16, 331/17, 34, 1 A; 332/127, 128; 327/157, 327/159; 375/376
See application file for complete search history.

(56) References Cited

U.S. PATENT DOCUMENTS 5,834,987 A    11/1998    Dent
6,844,763 B1 *    1/2005    Balboni .................. 327/159

FOREIGN PATENT DOCUMENTS

| DE | 199 29 167 A1 | 12/2000 |
| EP | 0 408 238 A2 | 1/1991 |
| GB | 2 317 512 A | 3/1998 |
| GB | 2 354 649 A | 3/2001 |
| WO | WO 99/07065 | 2/1999 |
| WO | WO 99/14850 | 3/1999 |
| WO | WO 01/11783 A1 | 2/2001 |

OTHER PUBLICATIONS

Copy of the International Search Report, International Application No. PCT/DE02/01914, International Filing Date May 24, 2002, 6 pgs.

* cited by examiner

*Primary Examiner*—Arnold Kinkead
(74) *Attorney, Agent, or Firm*—Eschweiler & Associates, LLC

(57) ABSTRACT

A two-point modulator includes a PLL circuit and a simplified digital pre-filtering system. The two-point modulator includes a first circuit path for impressing an analog modulation signal into a first point in the PLL circuit, and a second circuit path for impressing a digital modulation signal into a second point in the PLL circuit. The second circuit path actuates a frequency divider in the feedback path in the PLL circuit and contains a digital filter which has a square-wave pulse response.

16 Claims, 1 Drawing Sheet

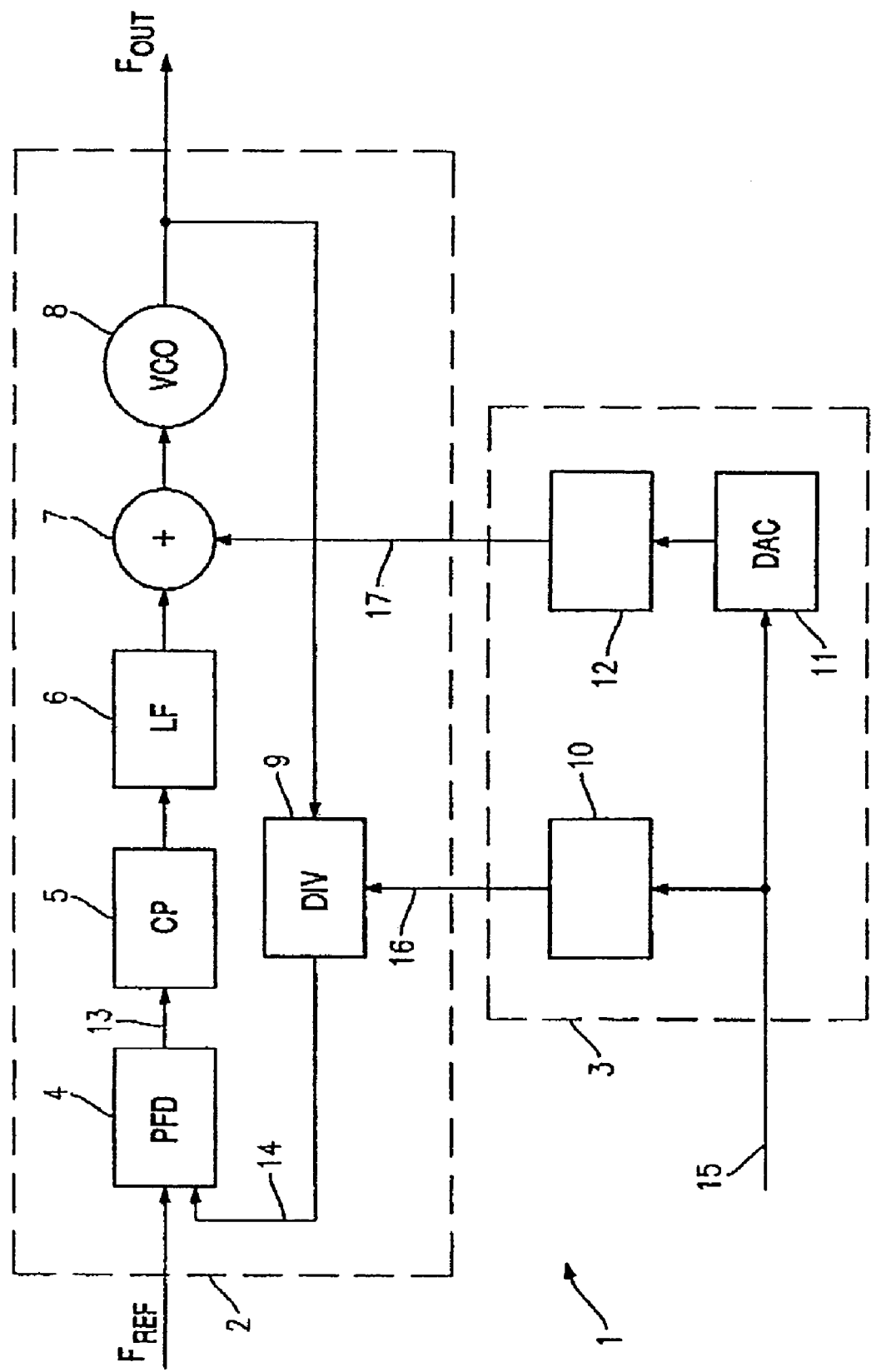

TWO-POINT MODULATOR COMPRISING A PLL CIRCUIT AND A SIMPLIFIED DIGITAL PRE-FILTERING SYSTEM

This application is a National Stage filing of International Application No. PCT/DE02/01914 filed May 24, 2002, which is entitled "Two-Point Modulator Comprising a PLL Circuit and a Simplified Digital Pre-filtering System", which was not published in English, that claims priority to German Patent Application No. 101 27 612.5 filed on Jun. 7, 2001.

FIELD OF THE INVENTION

The invention relates to a two-point modulator for phase or frequency modulation with a PLL circuit which is designed for impressing an analog and a digital modulation signal. In particular, the invention relates to the prefiltering of the digital modulation signal.

BACKGROUND OF THE INVENTION

A low-complexity implementation of a transmitter design for transceivers in mobile radio systems is provided by transmitters which have a modulator operating on the basis of the known principle of two-point modulation. In this case, a PLL (Phase Locked Loop) circuit is used as a frequency synthesizer and is used for phase or frequency modulation of a radio-frequency signal.

The modulation signals are usually impressed at two points in the PLL circuit. First, a programmable frequency divider in the PLL circuit is actuated by a digital modulation signal. The programmable frequency divider is fitted in the PLL circuit's feedback path and represents a point in the PLL circuit at which a low-pass response is obtained for impressing a modulation. In this case, the digital modulation signal can have a larger bandwidth than the low-pass filter formed by the PLL circuit. Secondly, an analog modulation signal is injected into a summation point which is situated in the PLL circuit's forward path and is preferably connected upstream of the voltage controlled oscillator. The analog modulation supplied at the summation point has a high-pass filtering effect on the output of the PLL circuit on account of the closed control loop, which means that the corresponding modulation signal is in turn corrupted by the response. The digital and analog modulation signals are superimposed on one another at the output of the PLL circuit, and in this way a frequency-independent response for the PLL circuit is obtained. The simultaneous impression of a digital and an analog modulation signal into a PLL circuit is called two-point modulation.

Such a two-point modulator and a method for phase or frequency modulation with a PLL circuit is described in German laid-open specification DE 199 29 167 A1. A digital modulation signal is supplied to the control connection of a frequency divider in the PLL circuit's feedback path, and this determines the number by whose reciprocal the instantaneous frequency of the input signal for the frequency divider is multiplied. In addition, the digital modulation signal is converted by means of a digital/analog converter into an analog modulation signal which is injected into the PLL circuit at a summation point which represents a high-pass point. This laid-open specification can be regarded as the closest prior art to the present invention.

In the case of the described type of transmitter design, the control loop remains closed. To achieve low noise in the PLL circuit, the bandwidth of the PLL circuit is designed to be much smaller than would be necessary for transmitting the modulated data. To compensate for the small bandwidth, the analog modulation signal is injected into the PLL circuit in addition to the digital modulation signal.

Both the digital modulation signal and the analog modulation signal are prefiltered in order to limit the PLL circuit's output spectrum. The digital modulation signal is usually filtered by means of oversampling, i.e. one bit is represented by a plurality of samples. In addition, for two-point modulation to work correctly, it is necessary for a high degree of correspondence between the amplitudes of the two modulation signals to be ensured in addition to phase equality over time. In the case of known two-point modulators, filters having the same pulse shaping are used for the digital and analog prefiltering for this reason. A drawback of this is the correspondingly high implementation complexity for such digital and analog filters.

SUMMARY OF THE INVENTION

It is therefore an object of the invention to create a two-point modulator for phase or frequency modulation with a PLL circuit, in which the filters used for prefiltering the digital and analog modulation signals can have different pulse shapings and at least one of the two filters is intended to have the lowest implementation complexity possible, without significantly altering the two-point modulator's transmission spectrum in the process.

The object on which the invention is based is achieved by the features of the independent patent claims. Advantageous developments and refinements are specified in the subclaims.

An inventive two-point modulator which is used for phase or frequency modulation has a PLL circuit. In addition, the two-point modulator comprises a first circuit path, which impresses an analog modulation signal into a first point in the PLL circuit. In this case, the position of the first point is chosen such that the analog modulation signal supplied to the PLL circuit at this point has a high-pass filtering effect on the output of the PLL circuit on account of the closed control loop. Advantageously, the first point is situated upstream of a voltage controlled oscillator contained in a PLL circuit. In addition, the two-point modulator comprises a second circuit path, which impresses a digital modulation signal into a second point in the PLL circuit. The second circuit path is connected to the control connection of a frequency divider which, in the case of two-point modulators, is contained in the PLL circuit's feedback path. The result of this is that the digital modulation signal, which actuates the frequency divider and thus prescribes the number required for frequency division, has a low-pass filtering effect on the output of the PLL circuit. A fundamental concept of the invention is that the second circuit path contains a digital filter which has a square-wave pulse response, i.e. in the frequency domain the digital filter has an almost constant response on account of the oversampling in the passband of the low-pass filter formed by the PLL circuit.

The digital filter contained in the second circuit path can be produced by a digital filter with a square-wave pulse response on account of the small bandwidth of the closed PLL control loop. Usually, there is not much difference between the transfer functions of a digital filter which is normally used for these purposes and of a digital filter with a square-wave pulse response within the small bandwidth of the PLL control loop. The present invention therefore makes it possible for the complex digital filter used to date, whose pulse response frequently has the shape of a Gaussian curve, to be replaced by a simple digital filter having a square-wave pulse response (square-wave filter), without the possibility of identifying any significant difference in the two-point modulator's transmission spectrum. The first circuit path remains unaffected by this invention.

As in the case of known two-point modulators with PLL circuits, provision can also be made for the first circuit path to contain a filter, which can be an analog filter, for example. The pulse shaping of the filter contained in the first circuit path can differ from the inventive square-wave pulse shaping in the digital filter. Provision can also be made for the modulation signal transmitted by the first circuit path also to be filtered in the digital domain using downstream digital/analog conversion.

Advantageously, the purpose of digital square-wave filtering can be served by incorporating a digital filter into the two-point modulator whose transfer function is characterized in that a value received at the input of the digital filter, which value has been stored in a register, for example, is output a plurality of times at the output of the digital filter.

In another advantageous refinement of the invention, the amplitude of the pulse response of the digital filter can be controlled using a unit. This allows the amplitude of the digital modulation signal and hence the modulation index to be adjusted in a simple manner if required. By contrast, known two-point modulators with the same filter function for the digital and analog filtering require each filter coefficient to be adjusted individually, or require additional multiplication or division to be carried out with appropriate rounding operations.

Another aspect of the invention relates to a method for phase or frequency modulation with a PLL circuit which operates on the basis of the principle of two-point modulation. The inventive method involves an analog modulation signal being injected into the PLL circuit at a first point. The first point has to satisfy the condition that a high-pass response is obtained there for an injected modulation frequency. A digital modulation signal first passes through a digital filter and is then injected into the PLL circuit at a second point. In this case, the digital modulation signal actuates a frequency divider which is incorporated in a feedback path in the PLL circuit and on which a low-pass response is obtained for the digital modulation signal. The inventive method is characterized in that the digital filter has a square-wave pulse response.

One advantage of the inventive method is the low implementation complexity for the digital filtering. The small bandwidth of the closed PLL control loop means that there is not much difference between the transfer functions of a normally used digital filter, which has the same pulse shape as a filter which is usually used for filtering the analog modulation signal, and of a digital filter with a square-wave pulse response within the PLL control loop's bandwidth. It is therefore not possible to identify any significant difference in the PLL circuit's transmission spectrum.

BRIEF DESCRIPTION OF THE DRAWINGS

FIG. 1 is a block level schematic diagram illustrating a modulator circuit containing a phase locked loop circuit according to the present invention.

DETAILED DESCRIPTION OF THE INVENTION

The invention is explained below by way of example using an exemplary embodiment which is shown in a drawing. The single FIGURE shows a schematic diagram of a two-point modulator with a PLL circuit and a modulation circuit.

The FIGURE shows a two-point modulator 1 with a PLL circuit 2. The PLL circuit 2 produces an output signal with an output frequency $F_{OUT}$ from an input or reference signal with a reference frequency $F_{REF}$. The output signal with the output frequency $F_{OUT}$ can be modulated by a digital modulation signal 16 and an analog modulation signal 17.

Besides the PLL circuit 2, the two-point modulator 1 comprises a modulation circuit 3 which is coupled to the PLL circuit 2 at suitable points and is used to modulate the output signal from the PLL circuit 2.

The PLL circuit 2 contains a phase detector PFD (Phase Frequency Detector) 4, to whose inputs the reference signals with the reference frequency $F_{REF}$ and a fed back frequency divider signal 14 are supplied. The reference signal is derived from a quartz oscillator, for example. The phase detector 4 compares the phases of the two signals supplied on the input side and, on the output side, produces a control signal 13 which corresponds to the phase difference between the two signals supplied to its inputs. The control signal 13 is input to an input on a charge pump CP 5. The charge pump 5 takes the control signal 13 as a basis for generating a current for the purpose of charging a loop filter LF 6 which is connected downstream of the charge pump 5. The loop filter 6 contains an integrating portion and a low-pass filter for smoothing the control signal 13. The signal which is output by the loop filter 6 passes through a summation point 7, which is used for injecting the analog modulation signal 17, and is then supplied to a voltage controlled oscillator VCO 8. The voltage controlled oscillator 8 represents the oscillation-producing element in the PLL circuit 2 and generates the output signal from the PLL circuit, which output signal has the output frequency $F_{OUT}$.

The control loop in the PLL circuit 2 is closed by a feedback path. The feedback path supplies the output signal from the voltage controlled oscillator 8 to an input on the phase detector 4 via a programmable frequency divider DIV 9. Normally, the programmable frequency divider 9 is in the form of a multi-modulus frequency divider. In the steady state of the PLL circuit 2, the output frequency $F_{OUT}$ of the output signal corresponds exactly to the multiple of the reference frequency $F_{REF}$, which multiple is determined by the programmable frequency divider 9.

The way in which the two-point modulator 1 works is known. Two-point modulation involves the modulation circuit 3 being used to impress the digital modulation signal 16 and the analog modulation signal 17 into the PLL circuit 2. The FIGURE shows an example of a modulation circuit 3 which conditions the digital and analog modulation signals 16 and 17 and supplies them to the PLL circuit 2. The exemplary modulation circuit 3 in the present case comprises a digital filter 10, a digital/analog converter DAC 11 and an analog filter 12.

An input on the modulation circuit 3 is supplied with a modulation signal 15, which is a digital signal in the present exemplary embodiment. The modulation signal 15 is supplied to the digital filter 10, which is a low-pass filter. Following the smoothing by the digital filter 10, the digital modulation signal 16 is supplied to a control input of the programmable frequency divider 9. By way of example, the digital modulation signal 16 has a succession of data words, with each data word representing a number. When each data word is received via its control input, the programmable frequency divider 9 is programmed such that it multiplies the frequency $F_{OUT}$ obtained from the voltage controlled oscillator 8 by the reciprocal of the number obtained.

In addition, the modulation signal 15 is supplied to the digital/analog converter 11 and, following conversion thereof into the analog domain, passes through the analog filter 12. Next, the analog modulation signal 17 which can be output at the output of the analog filter 12 is supplied to an input on the summation point 7.

Introducing the modulation into the PLL circuit 2 using the programmable frequency divider 9 weights the modulation signal 15 with a low-pass filter function.

This restricts the signal to a bandwidth which is generally smaller than the modulation bandwidth. However, an essentially frequency-independent response for the PLL circuit 2 is required. For this reason, the modulation is supplied to the PLL circuit 2 at a point with a high-pass response. In the present PLL circuit 2, this is done at the summation point 7. There, the analog modulation signal 17 is superimposed on the conditioned control signal 13, so that the sum of both signals controls the voltage controlled oscillator 8.

To obtain the highest possible spectral efficiency for the output signal from the voltage controlled oscillator 8, the digital modulation signal 16 is prefiltered using the digital filter 10, and the analog modulation signal 17 is prefiltered using the analog filter 12. In line with the invention, a digital filter 10 with square-wave pulse shaping is used for this purpose. In the case of the present two-point modulator 1, the small bandwidth of the closed PLL circuit 2 means that such a digital filter 10 can be used without adversely affecting the transmission spectrum of the two-point modulator 1. It is also not necessary for the digital filter 10 and the analog filter 12 to have the same pulse shaping.

The invention claimed is:

1. A two-point modulator circuit, comprising:
   a phase locked loop circuit having a first circuit path operable to generate and input an analog modulation signal into a first node of the phase locked loop circuit having a high-pass response, the phase locked loop circuit having a second circuit path operable to generate and input a digital modulation signal into a second node of the phase locked loop circuit having a low-pass response,
   wherein the phase locked loop circuit further comprises a feedback path having a frequency divider therein, and wherein frequency divider comprises the second node, and
   wherein the second circuit path comprises a digital filter having a square-wave pulse response that outputs a value received at its input, wherein the digital filter outputs the value a plurality of times within a square-wave window and stores such values in a register.

2. The two-point modulator of claim 1, wherein the first circuit path further comprises an analog filter operable to output the analog modulation signal.

3. The two-point modulator of claim 1, wherein the digital filter further comprises a control unit operable to control an amplitude of the square-wave pulse response.

4. The two-point modulator of claim 1, wherein the phase locked loop circuit further comprises:
   a voltage controlled oscillator operable to provide a phase- or frequency-modulated output signal at its output;
   a phase detector operable to ascertain a phase difference between a feedback signal in the feedback path derived from the output of the voltage controlled oscillator and a reference signal, and further operable to actuate the voltage controlled oscillator based on the ascertained phase difference; and
   the feedback path containing the feedback signal and the frequency divider.

5. The two-point modulator of claim 4, wherein the first node in the phase locked loop comprises a summation node and resides upstream of the voltage controlled oscillator.

6. A method for phase or frequency modulation employing two-point modulation with a phase locked loop circuit, comprising:
   injecting an analog modulation signal into a first node of the phase locked loop circuit, wherein the first node provides a high-pass response for a modulation frequency;
   digitally filtering a digital modulation signal, wherein the digital filtering comprises a square-wave pulse response wherein a value of the digital modulation signal is received and stored in a register a plurality of times in a square-wave window;
   injecting the filtered digital modulation signal into a second node of the phase locked loop circuit, and
   actuating a frequency divider with the filtered digital modulation signal, the frequency divider residing in a feedback path in the phase locked loop circuit, and wherein the second node provides a low-pass response for a modulation frequency.

7. The method of claim 6, further comprising analog filtering the analog modulation signal prior to injecting the analog modulation into the first node of the phase locked loop circuit.

8. The method of claim 6, further comprising controlling an amplitude of the square-wave pulse response of the digital filter.

9. The method of claim 6, wherein the phase locked loop circuit comprises a voltage controlled oscillator operable to provide a phase- or frequency-modulated output signal at its output, a phase detector adapted to ascertain a phase difference between a feedback signal from the feedback path, derived from the modulated output signal, and a reference signal, and actuate the voltage controlled oscillator on the basis of the ascertained phase difference.

10. The method of claim 9, wherein the first node comprises a summation point in the phase locked loop circuit, wherein the summation point is connected upstream of the voltage controlled oscillator.

11. A two-point modulator circuit, comprising:
   a phase locked loop circuit having a forward path and a feedback path; and
   a modulator circuit comprising a digital modulation circuit and an analog modulation circuit,
   wherein the analog modulation circuit is adapted to input an analog modulation signal into a first node in the forward path of the phase locked loop circuit, and
   wherein the digital modulation circuit is adapted to provide a square-wave pulse response, wherein the digital modulation circuit receives an input modulation signal having a value and outputs the value a plurality of times within a square-wave window as a digital modulation signal, and wherein the digital modulation circuit is further adapted to input the digital modulation signal into a second node in the feedback path of the phase locked loop circuit.

12. The two-point modulator circuit of claim 11, wherein the first node has a high-pass response with the phase locked loop circuit.

13. The two-point modulator circuit of claim 11, wherein the second node has a low-pass response with the phase locked loop circuit.

14. The two-point modulator circuit of claim 11, wherein the analog modulation circuit receives the input modulation signal, converts the input modulation signal into an analog signal, and filters the analog signal to generate the analog modulation signal.

15. The two-point modulator of claim 11, wherein the phase locked loop circuit further comprises:
- a voltage controlled oscillator operable to provide a phase- or frequency-modulated output signal at its output;
- a phase detector operable to ascertain a phase difference between a feedback signal in the feedback path derived from the output of the voltage controlled oscillator and a reference signal, and further operable to actuate the voltage controlled oscillator based on the ascertained phase difference.

16. The two-point modulator of claim 15, wherein the phase locked loop circuit further comprises a frequency divider in the feedback path, adapted to divide a frequency of the output of the voltage controlled oscillator by a value associated with the digital modulation signal.

* * * * *